(12) United States Patent
Yu (10) Patent No.: US 8,297,787 B2
(45) Date of Patent: Oct. 30, 2012

(54) LED LIGHT BULBS IN PYRAMIDAL STRUCTURE FOR EFFICIENT HEAT DISSIPATION

(75) Inventor: Beijing Yu, Guangde (CN)

(73) Assignee: 1 Energy Solutions, Inc., Agoura Hills, CA (US)

( * ) Notice: Subject to any disclaimer, the term of this patent is extended or adjusted under 35 U.S.C. 154(b) by 246 days.

(21) Appl. No.: 12/542,903

(22) Filed: Aug. 18, 2009

(65) Prior Publication Data

US 2010/0264806 A1    Oct. 21, 2010

(30) Foreign Application Priority Data

Apr. 20, 2009   (CN) ...................... 2009 2 0172743 U (51) Int. Cl.
*F21S 4/00* (2006.01)
*F21V 21/00* (2006.01)
(52) U.S. Cl. .................................. 362/249.02; 362/800
(58) Field of Classification Search ............. 362/249.02, 362/227, 230, 231, 362, 363, 800
See application file for complete search history.

(56) References Cited

U.S. PATENT DOCUMENTS

| | | |
|---|---|---|
| 1,694,997 A | 12/1928 | VanHorn |
| 3,519,913 A | 7/1970 | Janecek |
| 3,593,038 A | 7/1971 | Hylten-Cavallius |
| 3,639,822 A | 2/1972 | Brown |
| 3,758,771 A | 9/1973 | Frohardt |
| 4,035,681 A | 7/1977 | Savage |
| 4,074,165 A | 2/1978 | Moriyama |
| 4,223,248 A | 9/1980 | Tong |
| 4,298,869 A | 11/1981 | Okuno |
| 4,316,125 A | 2/1982 | Noguchi |
| 4,321,598 A | 3/1982 | Warner |
| 4,329,625 A | 5/1982 | Nishizawa |
| 4,348,663 A | 9/1982 | Yanagishima |
| 4,365,244 A | 12/1982 | Gillessen |
| 4,367,471 A | 1/1983 | Gillessen |
| 4,396,823 A | 8/1983 | Nihei |
| 4,492,952 A | 1/1985 | Miller |
| 4,521,835 A | 6/1985 | Meggs |
| 4,528,619 A | 7/1985 | Dolan |
| 4,595,920 A | 6/1986 | Runyan |
| 4,652,981 A | 3/1987 | Glynn |

(Continued)

FOREIGN PATENT DOCUMENTS

CA    2342321    3/2000

OTHER PUBLICATIONS www.optics.org, The Online Photonics Resource.

(Continued)

*Primary Examiner* — Danielle Allen
(74) *Attorney, Agent, or Firm* — Bridget A. Cochran; Cochran Freund & Young LLC (57) ABSTRACT

Disclosed is an LED light bulb having safe and efficient heat dissipation, while also providing maximum light distribution by providing multiple printed circuit boards arranged in a pyramidal structure, having multiple LEDs. The multiple printed circuit boards are connected by conductor wires contained within a transparent housing, so that the multiple printed circuit boards sit on a base of the LED light bulb. A bottom printed circuit board may also be employed if additional circuitry is desired.

3 Claims, 5 Drawing Sheets

U.S. PATENT DOCUMENTS

| | | | |
|---|---|---|---|
| 4,675,575 A | 6/1987 | Smith | |
| 4,727,603 A | 3/1988 | Howard | |
| 4,807,098 A | 2/1989 | Ahroni | |
| 4,839,777 A | 6/1989 | Janko | |
| 4,843,280 A | 6/1989 | Lumbard | |
| 4,857,920 A | 8/1989 | Kataoka | |
| 4,954,822 A | 9/1990 | Borenstein | |
| 4,959,766 A | 9/1990 | Jain | |
| 4,967,330 A | 10/1990 | Bell et al. | |
| 5,087,212 A | 2/1992 | Hanami | |
| 5,130,897 A | 7/1992 | Kuzma | |
| 5,155,669 A | 10/1992 | Yamuro | |
| 5,187,377 A | 2/1993 | Katoh | |
| 5,193,895 A | 3/1993 | Naruke | |
| 5,257,020 A | 10/1993 | Morse | |
| 5,313,187 A | 5/1994 | Choi | |
| 5,321,593 A | 6/1994 | Moates | |
| 5,323,305 A | 6/1994 | Ikeda | |
| 5,366,780 A | 11/1994 | Rapisarda | |
| 5,404,282 A | 4/1995 | Klinke | |
| 5,410,458 A | 4/1995 | Bell | |
| 5,436,809 A | 7/1995 | Brassier | |
| 5,457,450 A | 10/1995 | Deese | |
| 5,463,280 A | 10/1995 | Johnson | |
| 5,481,444 A | 1/1996 | Schultz | |
| 5,499,174 A | 3/1996 | Lin | |
| 5,504,514 A * | 4/1996 | Nelson | 347/130 |
| 5,528,484 A | 6/1996 | Hayashi | |
| 5,567,037 A | 10/1996 | Ferber | |
| 5,580,156 A * | 12/1996 | Suzuki et al. | 362/184 |
| 5,580,159 A | 12/1996 | Liu | |
| 5,647,759 A | 7/1997 | Lien | |
| 5,649,755 A | 7/1997 | Rapisarda | |
| 5,655,830 A | 8/1997 | Ruskouski | |
| 5,660,560 A | 8/1997 | Chong | |
| 5,663,719 A | 9/1997 | Deese | |
| 5,670,847 A | 9/1997 | Lin | |
| 5,672,000 A | 9/1997 | Lin | |
| 5,681,107 A | 10/1997 | Wang | |
| 5,720,544 A | 2/1998 | Shu | |
| 5,722,860 A | 3/1998 | Pan | |
| 5,726,535 A | 3/1998 | Yan | |
| 5,762,419 A | 6/1998 | Yam | |
| 5,808,592 A | 9/1998 | Mizutani | |
| 5,887,967 A | 3/1999 | Chang | |
| 5,890,794 A | 4/1999 | Abtahi | |
| 5,936,599 A | 8/1999 | Reymond | |
| 5,941,626 A | 8/1999 | Yamuro | |
| 5,962,971 A | 10/1999 | Chen | |
| 5,988,831 A | 11/1999 | Pan | |
| 6,048,074 A | 4/2000 | Wang | |
| 6,072,280 A | 6/2000 | Allen | |
| 6,079,848 A | 6/2000 | Ahroni | |
| 6,120,312 A | 9/2000 | Shu | |
| 6,183,104 B1 | 2/2001 | Ferrara | |
| 6,183,310 B1 | 2/2001 | Shu | |
| 6,190,021 B1 | 2/2001 | Huang | |
| 6,200,003 B1 | 3/2001 | Tseng | |
| 6,220,722 B1 * | 4/2001 | Begemann | 362/231 |
| 6,227,679 B1 | 5/2001 | Zhang | |
| 6,234,649 B1 | 5/2001 | Katougi | |
| 6,283,797 B1 | 9/2001 | Wu | |
| 6,361,198 B1 | 3/2002 | Reed | |
| 6,367,952 B1 | 4/2002 | Gibboney | |
| 6,461,019 B1 | 10/2002 | Allen | |
| 6,478,455 B2 | 11/2002 | Ahroni | |
| 6,505,954 B2 | 1/2003 | Chen | |
| 6,550,953 B1 | 4/2003 | Ichikawa et al. | |
| D474,848 S | 5/2003 | Lodhie | |
| D474,879 S | 5/2003 | Nason | |
| 6,598,996 B1 | 7/2003 | Lodhie | |
| 6,659,632 B2 * | 12/2003 | Chen | 362/545 |
| 6,659,932 B2 * | 12/2003 | Campbell et al. | 494/37 |
| D485,379 S | 1/2004 | Stekelenbug | |
| 6,709,132 B2 | 3/2004 | Ishibashi | |
| 6,717,526 B2 | 4/2004 | Martineau | |
| 6,739,733 B1 | 5/2004 | Lamke et al. | |
| 6,758,578 B1 | 7/2004 | Chou | |
| 6,830,358 B2 | 12/2004 | Allen | |
| 7,012,379 B1 | 3/2006 | Chambers et al. | |
| 7,014,352 B2 | 3/2006 | Wu | |
| 7,045,965 B2 | 5/2006 | Yu et al. | |
| 7,063,442 B2 | 6/2006 | Sugar | |
| 7,066,628 B2 | 6/2006 | Allen | |
| 7,066,636 B2 | 6/2006 | Wu | |
| 7,086,756 B2 | 8/2006 | Maxik | |
| 7,118,249 B2 | 10/2006 | Hsu et al. | |
| 7,172,314 B2 | 2/2007 | Currie et al. | |
| 7,217,005 B2 | 5/2007 | Lin | |
| 7,220,022 B2 | 5/2007 | Allen et al. | |
| 7,350,936 B2 | 4/2008 | Ducharme et al. | |
| 7,396,142 B2 | 7/2008 | Laizure, Jr. et al. | |
| 7,794,124 B2 * | 9/2010 | Hulsey et al. | 362/477 |
| 2002/0043943 A1 | 4/2002 | Menzer et al. | |
| 2002/0105438 A1 | 8/2002 | Forbes | |
| 2003/0025120 A1 | 2/2003 | Chang | |
| 2003/0079387 A1 | 5/2003 | Derose | |
| 2003/0147245 A1 | 8/2003 | Chen | |
| 2003/0198048 A1 | 10/2003 | Frederick | |
| 2004/0114367 A1 * | 6/2004 | Li | 362/248 |
| 2004/0135522 A1 | 7/2004 | Berman | |
| 2004/0140892 A1 | 7/2004 | Hanood | |
| 2004/0190289 A1 | 9/2004 | Liu | |
| 2004/0190290 A1 | 9/2004 | Zerphy et al. | |
| 2004/0233145 A1 | 11/2004 | Chiang | |
| 2005/0057187 A1 | 3/2005 | Catalano | |
| 2005/0162851 A1 | 7/2005 | Kazar et al. | |
| 2005/0174725 A1 | 8/2005 | Yong et al. | |
| 2005/0213324 A1 * | 9/2005 | Chen | 362/249 |
| 2006/0007679 A1 | 1/2006 | Allen | |
| 2006/0012349 A1 | 1/2006 | Allen | |
| 2006/0012997 A1 | 1/2006 | Catalano | |
| 2006/0044788 A1 | 3/2006 | Damrau | |
| 2006/0098442 A1 | 5/2006 | Yu | |
| 2006/0180822 A1 | 8/2006 | Yu | |
| 2006/0203482 A1 | 9/2006 | Allen | |
| 2006/0270250 A1 | 11/2006 | Allen | |
| 2006/0285325 A1 * | 12/2006 | Ducharme et al. | 362/231 |
| 2007/0025109 A1 | 2/2007 | Yu | |
| 2007/0064450 A1 | 3/2007 | Chiba et al. | |
| 2007/0183153 A1 | 8/2007 | Yu | |
| 2008/0013324 A1 | 1/2008 | Yu | |
| 2008/0024071 A1 | 1/2008 | Yu | |
| 2008/0025024 A1 | 1/2008 | Yu | |
| 2008/0094857 A1 | 4/2008 | Smith et al. | |
| 2008/0143234 A1 | 6/2008 | Yu | |
| 2008/0157686 A1 | 7/2008 | Chung et al. | |
| 2008/0285279 A1 | 11/2008 | Ng et al. | |
| 2009/0059565 A1 | 3/2009 | Bertram | |
| 2009/0116236 A1 | 5/2009 | Chiang | |
| 2009/0213602 A1 * | 8/2009 | Gallegos | 362/488 |

OTHER PUBLICATIONS http://ledmuseum.home.att.net/xmas1.htm;www.foreverbright.com.
U.S. Appl. No. 09/339,616; Inventor: Tuyet Thi Vo; abandoned.
U.S. Appl. No. 09/378,631, Inventor: Tuyet Thi Vo; abandoned.
U.S. Appl. No. 12/099,034, filed Apr. 7, 2008, by Jing Jing Yu.
U.S. Appl. No. 12/020,373, filed Jan. 25, 2008, by Jing Jing Yu.
U.S. Appl. No. 11/716,788, filed Mar. 12, 2007, by Jing Jing Yu.
U.S. Appl. No. 11/860,298, filed Sep. 24, 2007, by Jing Jing Yu.
U.S. Appl. No. 12/172,228, filed Jul. 12, 2008, by Jing Jing Yu.
U.S. Appl. No. 12/098,423, filed Apr. 5, 2008, by Jing Jing Yu.
U.S. Appl. No. 61/043,262, filed Apr. 8, 2008, by Jing Jing Yu.
U.S. Appl. No. 60/949,804, filed Jul. 13, 2007, by Jing Jing Yu.
U.S. Appl. No. 12/254,787, filed Oct. 20, 2008, by Jing Jing Yu.
Non-Final Office Action mailed May 23, 2005, in U.S. Appl. No. 10/767,820, filed Jan. 30, 2004 by Minzhu Li.
Non-Final Office Action mailed Aug. 18, 2008, in U.S. Appl. No. 11/461,293, filed Jul. 31, 2006, by Jing Jing Yu.
Non-Final Office Action mailed May 16, 2008, in U.S. Appl. No. 11/461,293, filed Jul. 31, 2006, by Jing Jing Yu.
Non-Final Office Action mailed Dec. 21, 2007, in U.S. Appl. No. 11/461,293, filed Jul. 31, 2006, by Jing Jing Yu.
Non-Final Office Action mailed Jun. 4, 2007, in U.S. Appl. No. 11/189,066, filed Jul. 26, 2005, by Jing Jing Yu.

Non-Final Office Action mailed Oct. 27, 2008, in U.S. Appl. No. 11/849,939, filed Sep. 4, 2007, by Jing Jing Yu.
Final Office Action mailed Sep. 25, 2008, in U.S. Appl. No. 11/849,939, filed Sep. 4, 2007, by Jing Jing Yu.
Non-Final Office Action mailed Mar. 20, 2008, in U.S. Appl. No. 11/849,939, filed Sep. 4, 2007, by Jing Jing Yu.
Non-Final Office Action mailed Feb. 7, 2006, in U.S. Appl. No. 10/984,651, filed Nov. 10, 2004, by Jing Jing Yu.
Non-Final Office Action mailed Feb. 15, 2007, in U.S. Appl. No. 11/056,148, filed Feb. 14, 2005, by Jing Jing Yu.
Non-Final Office Action mailed Jun. 14, 2007, in U.S. Appl. No. 11/350,343, filed Feb. 9, 2006, by Jing Jing Yu.
U.S. Appl. No. 12/431,098, filed Apr. 28, 2009, by Jing Jing Yu.
U.S. Appl. No. 11/831,929, filed Jul. 31, 2007, by Jing Jing Yu.
Chinese Patent Application No. 200920172743.1 filed Apr. 20, 2009 by Jing Jing Yu.
U.S. Appl. No. 12/957,294, filed Dec. 14, 2007, by Jing Jing Yu.

* cited by examiner

LED LIGHT BULBS IN PYRAMIDAL STRUCTURE FOR EFFICIENT HEAT DISSIPATION

CROSS-REFERENCE TO RELATED APPLICATIONS

This application claims priority to Chinese patent application number 200920172743.1, filed Apr. 20, 2009, by Beijing Yu. The entire content of the above mentioned application is hereby specifically incorporated herein by reference for all it discloses and teaches.

BACKGROUND

LEDs are increasingly being used to replace standard incandescent bulbs because LEDs are low in cost, have low electrical power consumption, and an increased lifespan. LEDs, in many instances, are safer to use and can be employed in environments in which incandescent bulbs cannot be employed.

SUMMARY

An embodiment may comprise a method for housing multiple LEDs in a LED light bulb comprising: providing a transparent housing and a base; providing a plurality of printed circuit boards having LEDs disposed substantially around peripheral edges of the plurality of printed circuit boards; constructing a pyramidal structure of the plurality of printed circuit boards by stacking the plurality of printed circuit boards in layers, so that the plurality of printed circuit boards form a pyramidal structure such that the peripheral edges of adjacent printed circuit boards of the plurality of printed circuit boards do not extend substantially beyond the LEDs that are disposed around the peripheral edges of the plurality of printed circuit boards and do not substantially block light and heat emitted from the LEDs; connecting the multiple printed circuit boards having the multiple LEDs with conductor wires.

An embodiment may further comprise an LED light bulb comprising: at least two printed circuit boards arranged in a pyramidal structure so that an upper printed circuit board with at least one LED has a smaller surface area than a lower printed circuit board, the smaller printed circuit board having a peripheral edge that does not substantially block light and heat emitted from LEDs connected to a lower printed circuit board; a transparent housing that encloses the at least two printed circuit boards that are arranged in the pyramidal structure.

An embodiment may further comprise an LED light bulb comprising: a first printed circuit board; a layer of LEDs disposed on the periphery of the first printed circuit board; a second printed circuit board connected to the first printed circuit board so that the second printed circuit board is aligned with the first printed circuit board in a pyramidal structure so that the second printed circuit board does not block light emitted from the first set of LEDs; a second layer of LEDs disposed on the periphery of the second printed circuit board; a transparent housing that encloses the first and second printed circuit boards.

DETAILED DESCRIPTION OF THE EMBODIMENTS

Figure 1:
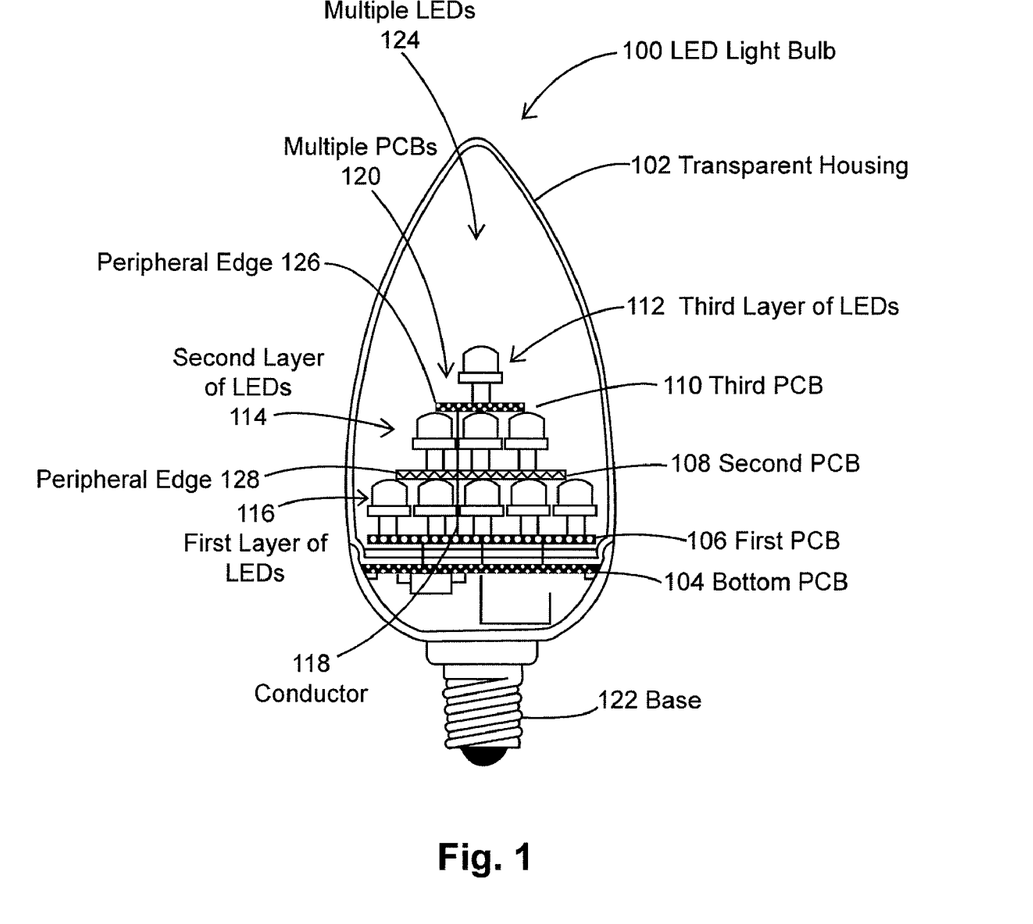
FIG. 1 is a side view of an embodiment of an LED bulb.

FIG. 1 is a side view of an embodiment of an LED bulb 100 having a transparent housing 102, and a base 122. As shown in FIG. 1, multiple printed circuit boards 120 are arranged in a pyramidal structure. Multiple LEDs 120 are attached to the upper surface of the multiple printed circuit boards 120. As illustrated in FIG. 1, there are three printed circuit boards, i.e., a first printed circuit board 106, a second printed circuit board 108, and a third printed circuit board 110. Transparent housing 102 surrounds the printed circuit boards 106, 108, 110 and is attached to base 122. The multiple printed circuit boards 120 are arranged in a pyramidal structure with multiple LEDs 124 attached to the three printed circuit boards 106, 108, 110. However, any number of printed circuit boards may be employed, which is dependent on the number of LEDs used and the total amount of space and volume available to house the multiple printed circuit boards 120.

As illustrated in FIG. 1, a transparent housing 102 surrounds and encloses multiple printed circuit boards 120 that are arranged in a pyramidal structure. Multiple LEDs 124 are conductively connected to the multiple printed circuit boards 120. The first printed circuit board 106 has a first layer of multiple LEDs 116 that are attached to the upper surface of the first printed circuit board 106. The second printed circuit board 108 has a second layer of multiple LEDs 114 attached to the upper surface of the second printed circuit board 108. The third printed circuit board 110 has a top layer of LEDs 112 attached to the top surface of the third printed circuit board 110. The printed circuit boards 106, 108, 110 are electrically connected together by conductors, such as conductor 118. The conductors 118 can also support the printed circuit boards 106, 108, 110 in the pyramidal structure illustrated in FIG. 1 or the printed circuit boards can be held in place in any other desirable manner. The bottom printed circuit board 104 is electrically connected to the first printed circuit board 106. The bottom printed circuit board 104 may contain electrical components, such as a rectifier circuit for rectifying alternating current that is obtained from base 122 for application of a DC potential to the multiple LEDs 124.

The printed circuit boards have a size, shape and vertical spacing so that light from the LEDs 111 is not substantially blocked by other LEDs or the printed circuit boards 106-110, especially in a horizontal and vertically upward direction, as illustrated in FIG. 1. As shown in FIG. 1, third printed circuit board 110 has an outer peripheral edge 126 that does not substantially overlap the second layer of multiple LEDs 114. Similarly, second printed circuit board 108 has a peripheral edge 128 that does not substantially overlap the first layer of multiple LEDs 116. In this manner, a maximum amount of light and heat can be emitted from the multiple LEDs 124 in an outward and upward direction without impinging upon a printed circuit board, such as printed circuit boards 108, 110.

The pyramidal structure illustrated in FIG. 1 facilitates safe and effective heat dissipation while also providing maximum light distribution, because light and heat dissipated from a lower LED layer is not blocked by an upper level printed circuit board. For example, second printed circuit board 108 has a smaller surface area than first printed circuit board 106, and third printed circuit board 110 has a smaller surface area than second printed circuit board 108 and first printed circuit board 106. Therefore, the pyramidal structure helps facilitate safe and efficient heat dissipation, while also providing maximum light distribution. In other words, third printed circuit board 110 does not substantially block light and heat dissipated from second printed circuit board 108, and second printed circuit board 108 does not substantially block light and heat dissipated from first printed circuit board 106.

As shown in FIG. 1, Each printed circuit board has at least one LED soldered to an upper surface. Hence, first printed circuit board 106 provides a first layer of LEDs 116, second printed circuit board 108 provides a second layer of multiple LEDs 114, and a third printed circuit board 110 provides at least one LED as a third layer of LEDs 112. As disclosed below, each layer of LEDs can comprise a single row of LEDs or multiple rows, depending upon the space that is available inside the transparent housing 102. The multiple printed circuit boards 106, 108, 110 are connected by conductor 118. A bottom printed circuit board 104 can be employed when additional circuitry is needed or desired, such as resistors, diodes, capacitors, inductors, etc. For example, a rectification circuit can be disposed on bottom printed circuit board 104. A two sided printed circuit board can be used for the first printed circuit board 106, so that bottom printed circuit board 104 can be eliminated.

Figure 2:
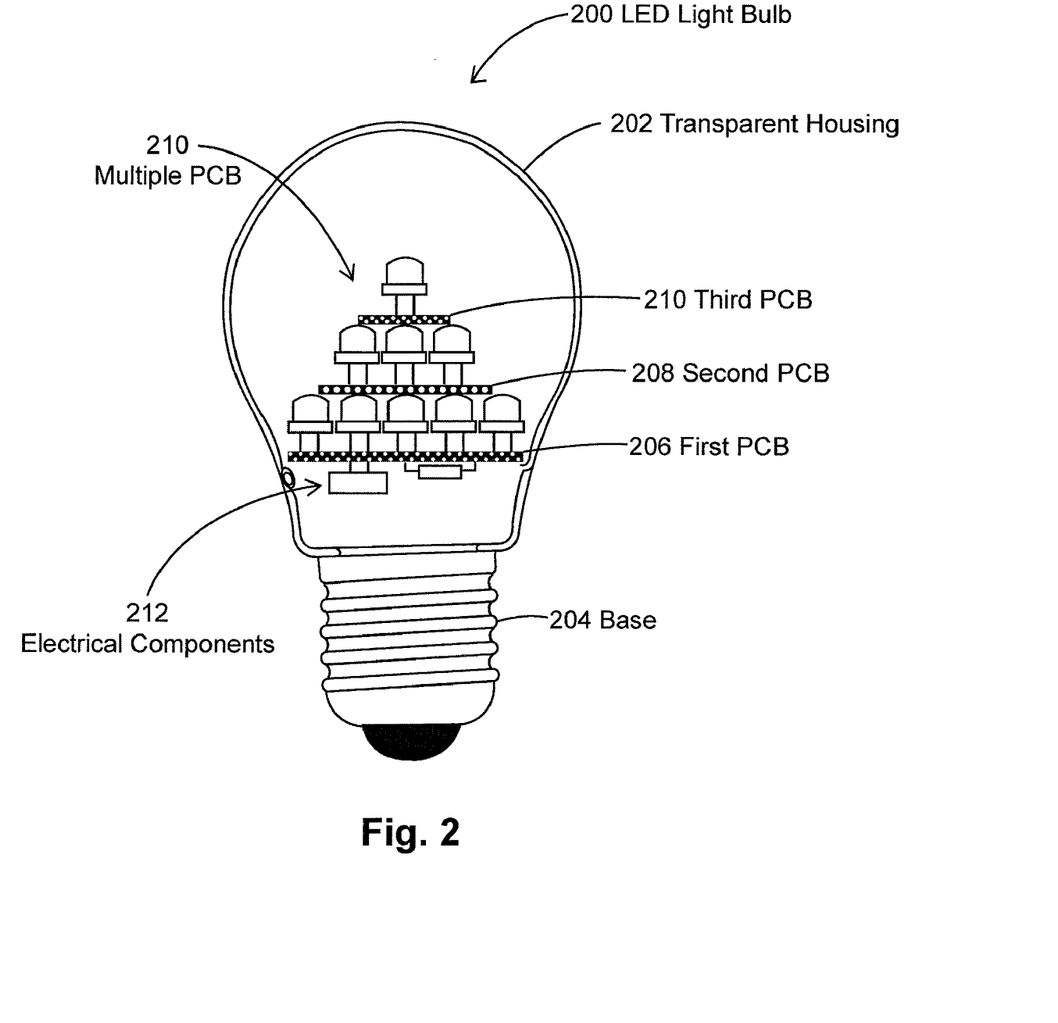
FIG. 2 is a side view of another embodiment of an LED bulb having an additional shape of a transparent housing.

FIG. 2 is a side view of LED light bulb 200, which illustrates an additional shape of a transparent housing 202 that may be employed. FIG. 2 has a transparent housing 202, and a base 204. Contained within the transparent housing 202 are multiple printed circuit boards 210 arranged in a pyramidal structure, which comprise a first printed circuit board 206, and a second printed circuit board 208, and a third printed circuit board 210. Again, any number of layers can be employed and is dependent upon the number of LEDs used, and the total amount of space and volume available to house the multiple printed circuit board.

The embodiment of the LED light bulb 200 that is illustrated in FIG. 2 is similar and operates in substantially the same manner as the embodiment of the LED light bulb 100, illustrated in FIG. 1. However, the first printed circuit board 206 comprises a double sided printed circuit board, which contains electrical components 212 on the bottom side of the first printed circuit board 206, as shown in FIG. 2. By using a double sided printed circuit board for the first printed circuit board 206, additional space can be saved within the transparent housing 202. Of course, a separate printed circuit board can be used, as illustrated in FIG. 1, for mounting electrical components, as shown in FIG. 1.

Figure 3:
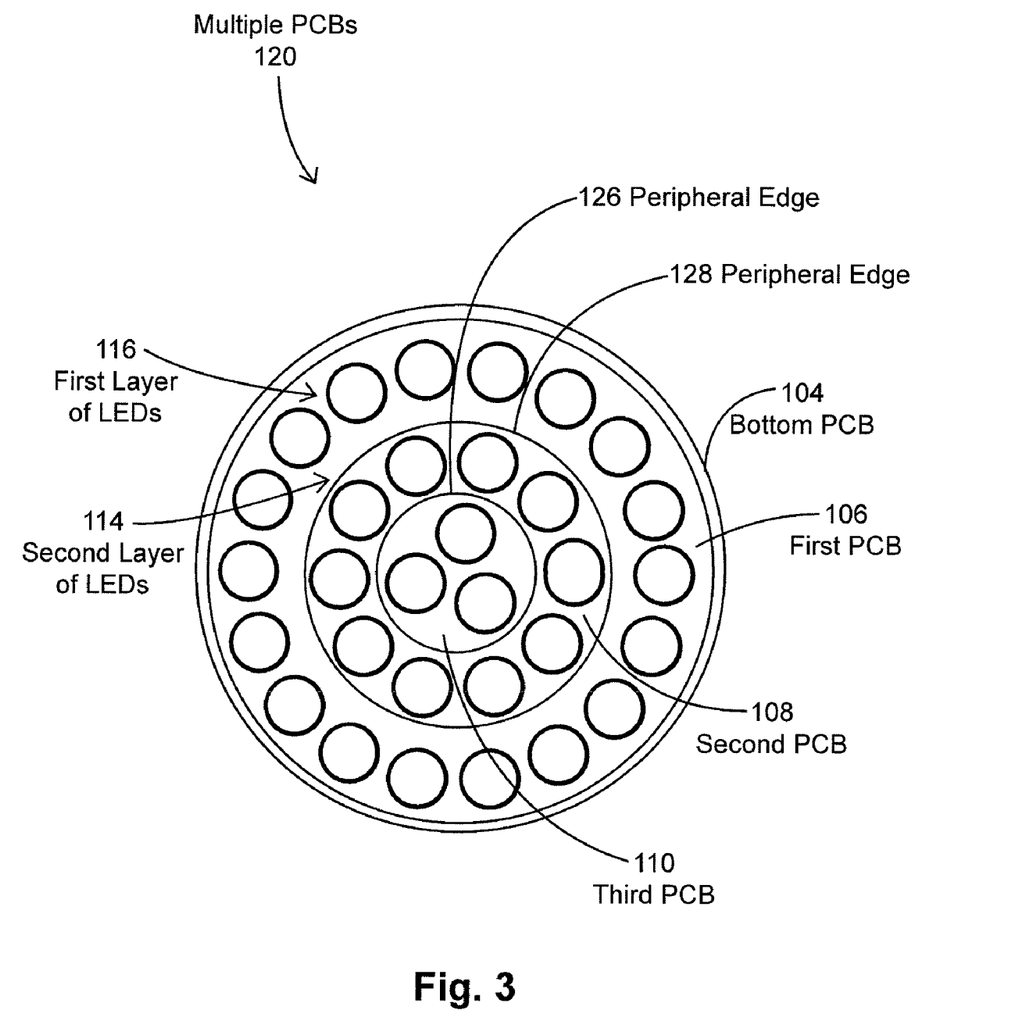
FIG. 3 is a top view of embodiment of FIG. 1.

FIG. 3 is a top view of the embodiment shown in FIG. 1, showing multiple printed circuit boards 120 in a pyramidal structure. As shown in FIG. 3, the LEDs on each printed circuit board at each different layer 104, 106, 108, 110 do not block light and heat dissipated from the LEDs that are disposed around the periphery of each of the printed circuit boards. The printed circuit boards are stacked in a pyramidal fashion so that the printed circuit board of each higher layer does not substantially block light in a horizontal or vertically upward direction from a lower layer of LEDs. As shown in FIG. 3, the peripheral edge of each printed circuit board does not overlap LEDs of a lower or adjacent layer of LED disposed on the periphery of an adjacent printed circuit board. For example, peripheral edge 126 does not substantially block light and heat dissipated from second layer of LEDs 114 and peripheral edge 128 does not block light and heat dissipated from first layer of LEDs 116. FIG. 3 is used as an illustrative example, and the number of printed circuit boards and LEDs could be increased or decreased depending on the volume and space available to house the desired amount of printed circuit board levels and LED layers.

Figure 4:
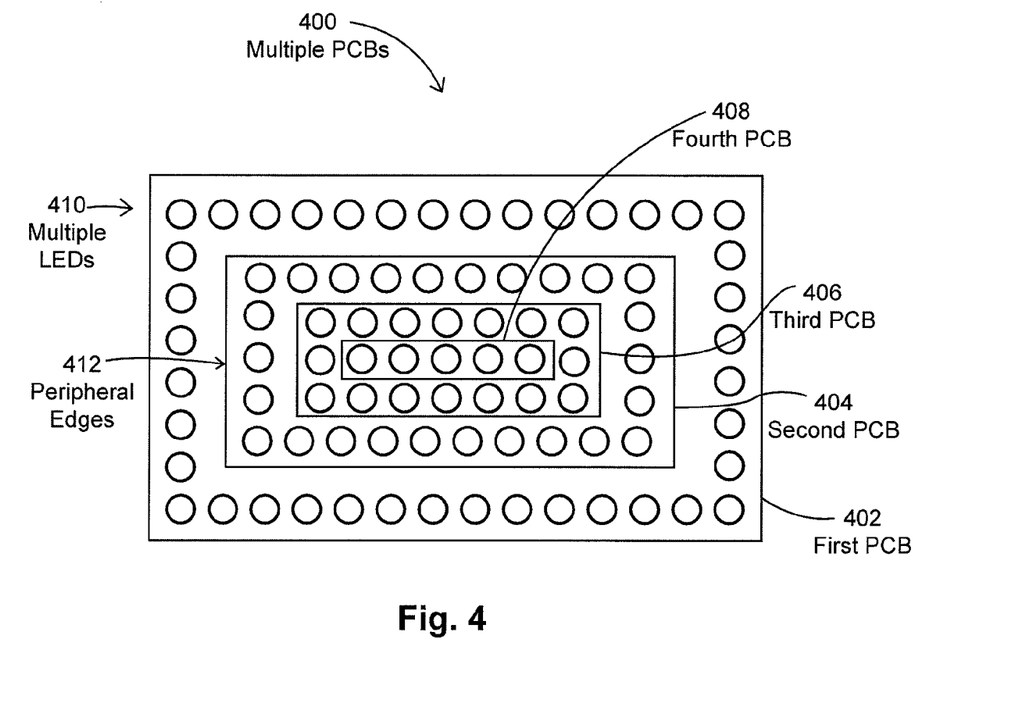
FIG. 4 is a top view of another embodiment of an LED bulb having multiple printed circuit boards arranged in a pyramidal structure having multiple LEDs, wherein the multiple printed circuit boards are similar in shape.

FIG. 4 is a top view of multiple printed circuit boards 400 arranged in a pyramidal structure having multiple LEDs 410, so that the multiple printed circuit boards are similar in shape. For example, first printed circuit board 402 is rectangular in shape and is beneath second printed circuit board 404, which is also rectangular in shape. The second printed circuit board 404 is smaller in area than first printed circuit board 402. Third printed circuit board 406 has a smaller area than, and is above second printed circuit board 404, which also has a rectangular shape. A fourth printed circuit board 408 has the smallest area of the printed circuit boards 402, 404, 406, and is also rectangular in shape. The rectangular shape of multiple printed circuit boards 400 is shown by way of example and many other various shapes may be employed. For example, multiple printed circuit boards 400 may be shaped in a polygon, curved, oblong, or circular shape, as long as the peripheral edges 412 do not substantially block light and heat dissipated from a lower or adjacent layer of LEDs.

Figure 5:
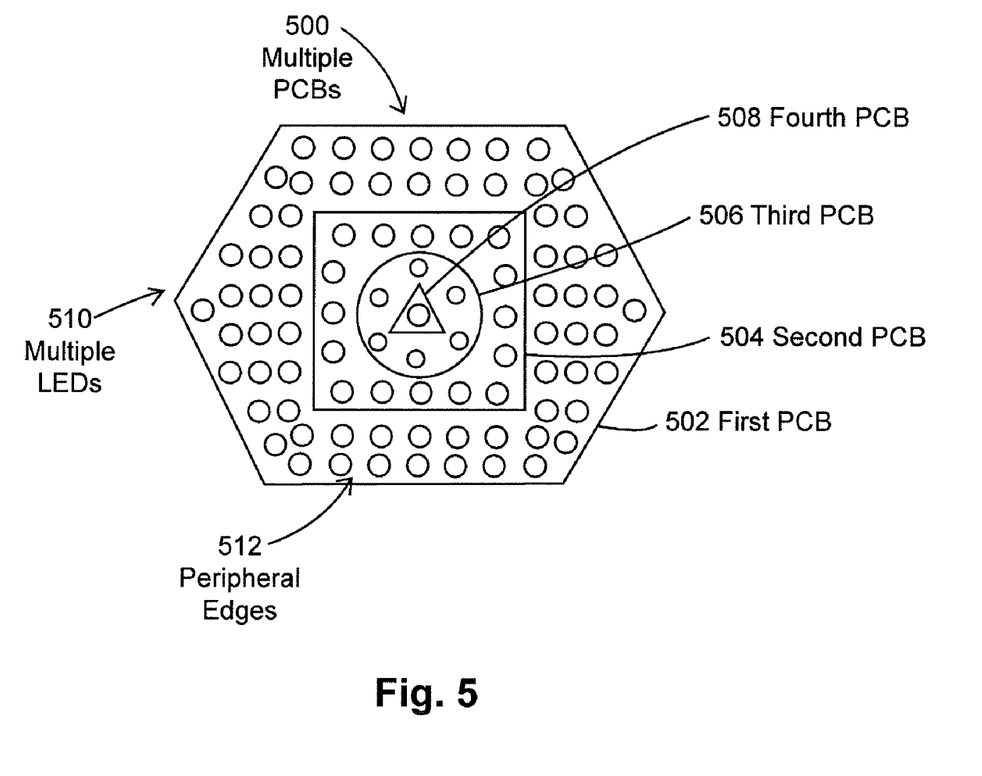
FIG. 5 is a top view of another embodiment of an LED bulb having multiple printed circuit boards arranged in a pyramidal structure, having multiple LEDs wherein the multiple printed circuit boards can vary in shape.

FIG. 5 is a top view of multiple printed circuit boards 500 that are arranged in a pyramidal structure. FIG. 5 illustrates that many printed circuit boards may be employed having various shapes which employ multiple LEDs 510. For example, first printed circuit board 502 has a different shape than second printed circuit board 504. Third printed circuit board 506 has a different shape than second and first printed circuit boards 504, 502. Fourth printed circuit board 508 also has a different shape than the first, second and third printed circuit boards 502, 504, 506. Although the embodiment in FIG. 5 shows printed circuit boards of varying shapes, there is no requirement that the printed circuit boards have varying shapes, but is given as an example of various shapes that could be employed. More importantly, any desired shape can be used, as long as peripheral edges 512 do not substantially block light and heat dissipated from a lower or adjacent layer of LEDs.

The foregoing description of the disclosed embodiments has been presented for purposes of illustration and description. It is not intended to be exhaustive or to limit the embodiments to the precise form disclosed, and other modifications and variations may be possible in light of the above teachings. The embodiments were chosen and described in order to best explain the principles of the description and its practical application to thereby enable others skilled in the art to best utilize the disclosed description in various embodiments and various modifications, as suited to the particular use contemplated.

What is claimed is:

1. A method for housing multiple light emitting diodes in a light emitting diode light bulb comprising:
providing a transparent housing and a base that forms an electrical socket;
providing a plurality of printed circuit boards having different sizes;
mounting said light emitting diodes on outer peripheral edges of said plurality of printed circuit boards so that said light emitting diodes face in a substantially uniform direction that is substantially perpendicular to said plurality of said printed circuit boards;
constructing a pyramidal structure of said plurality of printed circuit boards by stacking said plurality of printed circuit boards in substantially parallel planes along an axis to form substantially parallel layers of said printed circuit boards, said plurality of printed circuit boards forming said pyramidal structure such that said outer peripheral edges of adjacent printed circuit boards of said plurality of printed circuit boards do not extend substantially over said light emitting diodes that are disposed around said outer peripheral edges of said plurality of printed circuit boards and do not substantially block light and heat emitted from said light emitting diodes in an axial direction, said printed circuit boards stacked substantially symmetrically along said axis to provide an axial spacing between said plurality of printed circuit boards, so that said light emitting diodes on said outer peripheral edge on each said printed circuit board layer do not block light and heat emitted by said light emitting diodes from adjacent layers of said printed circuit boards in a direction that is substantially perpendicular to said axis;

connecting said multiple printed circuit boards having said multiple light emitting diodes with connector wires.

2. The method of claim 1 further comprising;

disposing a bottom printed circuit board on said base that provides additional circuitry.

3. A light emitting diode light bulb comprising:

a first printed circuit board;

a first layer of light emitting diodes disposed on an outer peripheral edge of said first printed circuit board;

a second printed circuit board connected to said first printed circuit board so that said second printed circuit board is substantially parallel to said first printed circuit board to form a pyramidal structure, said first printed circuit board being spaced apart from said second printed circuit board so that said second printed circuit board does not block light and heat emitted from said first layer of light emitting diodes in a direction that is substantially parallel to said first printed circuit board, said second printed circuit board having a size and shape so that said second printed circuit board does not substantially block light and heat emitted from said first layer of light emitting diodes in a direction that is substantially perpendicular to said first printed circuit board;

a second layer of light emitting diodes disposed on the periphery of said second printed circuit board so that said first layer of light emitting diodes and said second layer of light emitting diodes face in a substantially uniform direction which is substantially perpendicular to said first printed circuit board and said second printed circuit board;

a transparent housing that encloses said first and second printed circuit boards;

a base that forms an electrical socket;

at least one additional printed circuit board that is connected to an adjacent printed circuit board so that said at least one additional printed circuit board is substantially parallel to said adjacent printed circuit board and said first printed circuit board to form said pyramidal structure, said at least one additional printed circuit board being spaced apart from said adjacent printed circuit board so that said at least one additional printed circuit board does not block light and heat emitted from a layer of adjacent light emitting diodes disposed on said adjacent printed circuit board in a direction that is substantially parallel to said adjacent printed circuit board and said first printed circuit board, said at least one additional printed circuit board having a size and shape so that said at least one additional printed circuit board does not substantially block light and heat emitted from said layer of adjacent light emitting diodes disposed on said adjacent printed circuit board in a direction that is substantially perpendicular to said adjacent printed circuit board;

at least one additional layer of light emitting diodes disposed on said at least one additional printed circuit board so that said at least one additional layer of light emitting diodes and said layer of adjacent light emitting diodes disposed on said adjacent printed circuit board and said first layer of light emitting diodes face in a substantially uniform direction, which is substantially perpendicular to said first printed circuit board.

* * * * *